US012614014B1

(12) United States Patent
Li et al.

(10) Patent No.: US 12,614,014 B1
(45) Date of Patent: Apr. 28, 2026

(54) GROUPING CELLS IN CELL LIBRARY BASED ON ITERATIVE CLUSTERING

(71) Applicant: Cadence Design Systems, Inc., San Jose, CA (US)

(72) Inventors: Zhuo Li, Austin, TX (US); Natarajan Viswanathan, Austin, TX (US); Vitor Bandeira, Porto Alegre (BR); Yi-Xiao Ding, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 1392 days.

(21) Appl. No.: 17/314,951

(22) Filed: May 7, 2021

(51) Int. Cl.
*G06F 30/39* (2020.01)

(52) U.S. Cl.
CPC .................................... *G06F 30/39* (2020.01)

(58) Field of Classification Search
CPC ...................................................... G06F 30/39
See application file for complete search history.

(56) References Cited

U.S. PATENT DOCUMENTS

| | | | | |
|---|---|---|---|---|
| 6,031,980 A * | 2/2000 | Oota | ...................... | G06F 30/39 |
| | | | | 716/55 |
| 6,651,235 B2 | 11/2003 | Dai et al. | | |
| 6,865,726 B1 | 3/2005 | Igusa et al. | | |
| 7,216,329 B2 * | 5/2007 | Kitahara | ................. | G06F 30/30 |
| | | | | 716/108 |
| 7,530,047 B2 * | 5/2009 | Wang | ...................... | G06F 30/30 |
| | | | | 716/109 |

| | | | | |
|---|---|---|---|---|
| 7,752,233 B2 | 7/2010 | Vempala et al. | | |
| 8,949,764 B2 * | 2/2015 | Iyer | ...................... | G06F 30/327 |
| | | | | 716/132 |
| 9,183,335 B2 | 11/2015 | Ma et al. | | |
| 10,198,551 B1 * | 2/2019 | Farshidi | .............. | G06F 30/3312 |
| 10,990,721 B1 | 4/2021 | Reece et al. | | |
| 11,625,525 B1 * | 4/2023 | Li | ......................... | G06F 30/373 |
| | | | | 716/122 |
| 2005/0223344 A1 * | 10/2005 | Sato | ........................ | G06F 30/33 |
| | | | | 716/104 |
| 2006/0107239 A1 * | 5/2006 | Zhang | ................... | G06F 30/327 |
| | | | | 716/108 |
| 2009/0249259 A1 * | 10/2009 | Penzes | .................... | G06F 30/30 |
| | | | | 716/100 |
| 2009/0271756 A1 * | 10/2009 | Penzes | .................... | G06F 30/30 |
| | | | | 716/116 |

(Continued)

OTHER PUBLICATIONS

"U.S. Appl. No. 17/314,942, Non Final Office Action mailed Sep. 1, 2022", 10 pgs.

(Continued)

*Primary Examiner* — Pinping Sun
(74) *Attorney, Agent, or Firm* — Schwegman Lundberg & Woessner, P.A.

(57) ABSTRACT

Various embodiments provide for grouping cells in a cell library based on iterative clustering, which can be used for pruning the cell library. In particular, various embodiments provide for grouping cells in a cell library based on iterative clustering in view of a criterion (or cell attribute), and for pruning of the cell library based on the grouping of cells, which can optimize the cell library for the criterion. For instance, some embodiments provide for grouping cells in a cell library based on iterative clustering in view of leakage power and then applying cell library pruning to optimize for cell leakage power.

20 Claims, 10 Drawing Sheets

(56)  References Cited

U.S. PATENT DOCUMENTS

| | | | |
|---|---|---|---|
| 2013/0318488 A1* | 11/2013 | Iyer ....................... | G06F 30/327 |
| | | | 716/108 |
| 2014/0281573 A1* | 9/2014 | Jaffe ....................... | H04L 9/003 |
| | | | 713/189 |
| 2015/0033196 A1* | 1/2015 | Borah ................... | G06F 30/398 |
| | | | 716/108 |
| 2015/0128101 A1* | 5/2015 | Chen ....................... | G06F 30/30 |
| | | | 716/122 |
| 2023/0048356 A1* | 2/2023 | Zobeck .............. | C12N 15/1065 |
| 2024/0265181 A1* | 8/2024 | Cao .......................... | G06F 30/27 |

OTHER PUBLICATIONS

Alpert, C.J., "Buffer Library Selection,", 2000 IEEE, pp. 221-226., (2000).

U.S. Appl. No. 17/314,942, Examiner Interview Summary mailed Dec. 19, 2022, 2 pgs.

U.S. Appl. No. 17/314,942, Notice of Allowance mailed Jan. 17, 2023, 5 pgs.

U.S. Appl. No. 17/314,942, Response filed Dec. 15, 2022 to Non Final Office Action mailed Sep. 1, 2022, 13 pgs.

U.S. Appl. No. 17/314,942, Supplemental Notice of Allowability mailed Mar. 15, 2023, 2 pgs.

U.S. Appl. No. 17/314,942, filed May 7, 2021, Grouping Cells in Cell Library Based on Clustering.

* cited by examiner

200

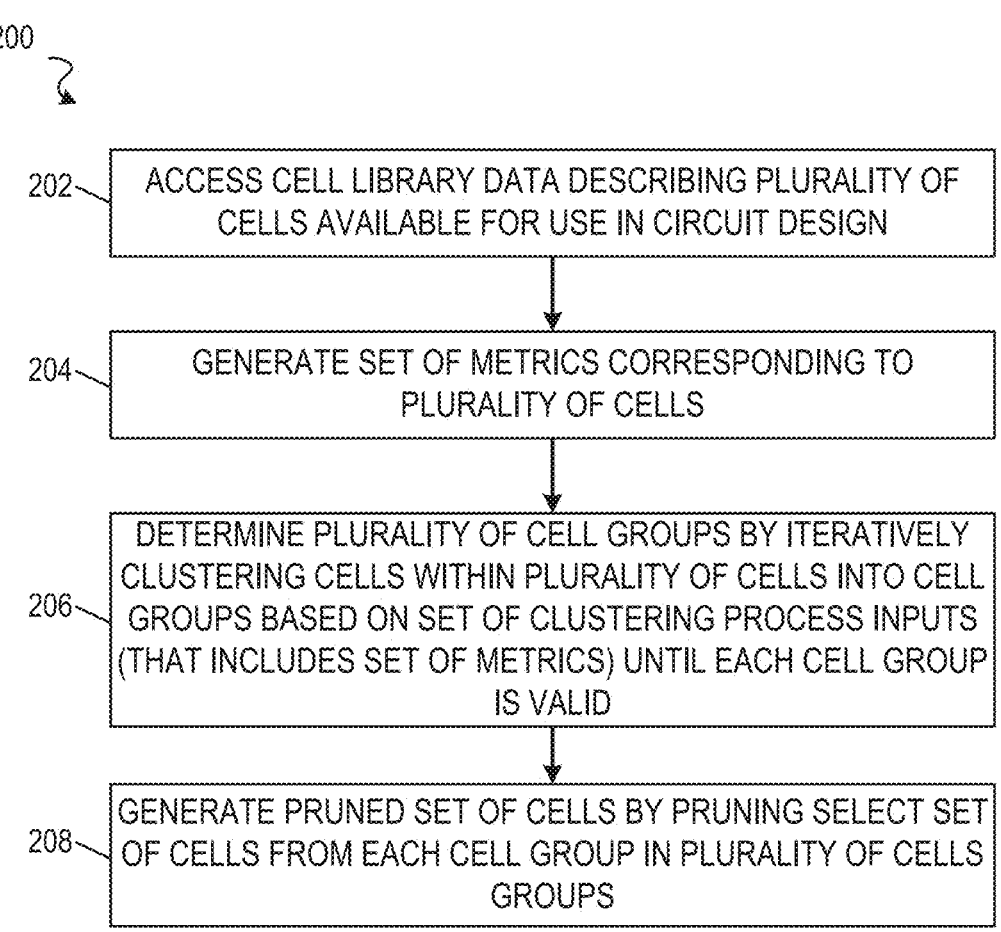

202 — ACCESS CELL LIBRARY DATA DESCRIBING PLURALITY OF CELLS AVAILABLE FOR USE IN CIRCUIT DESIGN

204 — GENERATE SET OF METRICS CORRESPONDING TO PLURALITY OF CELLS

206 — DETERMINE PLURALITY OF CELL GROUPS BY ITERATIVELY CLUSTERING CELLS WITHIN PLURALITY OF CELLS INTO CELL GROUPS BASED ON SET OF CLUSTERING PROCESS INPUTS (THAT INCLUDES SET OF METRICS) UNTIL EACH CELL GROUP IS VALID

208 — GENERATE PRUNED SET OF CELLS BY PRUNING SELECT SET OF CELLS FROM EACH CELL GROUP IN PLURALITY OF CELLS GROUPS

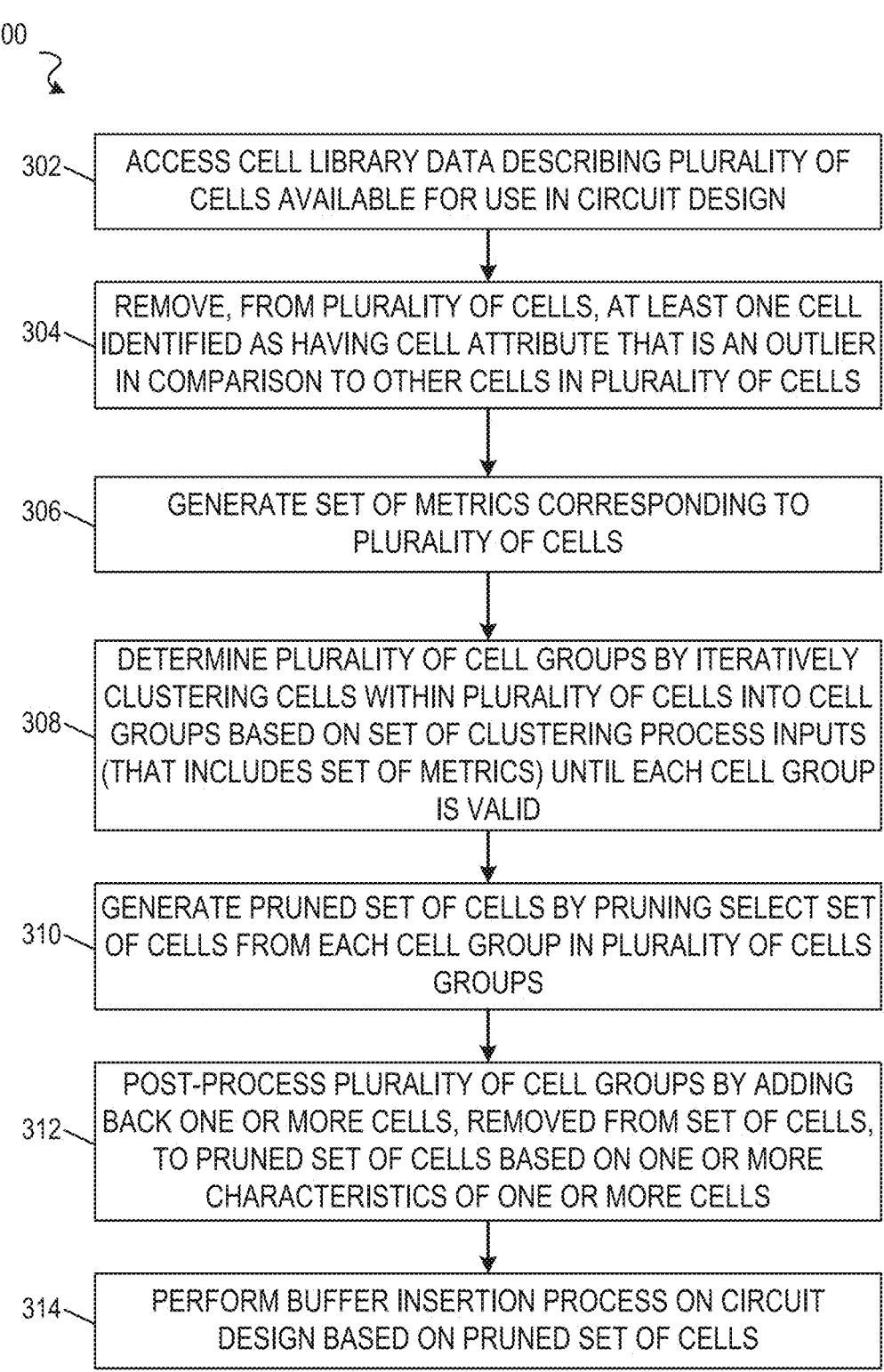

302 — ACCESS CELL LIBRARY DATA DESCRIBING PLURALITY OF CELLS AVAILABLE FOR USE IN CIRCUIT DESIGN

304 — REMOVE, FROM PLURALITY OF CELLS, AT LEAST ONE CELL IDENTIFIED AS HAVING CELL ATTRIBUTE THAT IS AN OUTLIER IN COMPARISON TO OTHER CELLS IN PLURALITY OF CELLS

306 — GENERATE SET OF METRICS CORRESPONDING TO PLURALITY OF CELLS

308 — DETERMINE PLURALITY OF CELL GROUPS BY ITERATIVELY CLUSTERING CELLS WITHIN PLURALITY OF CELLS INTO CELL GROUPS BASED ON SET OF CLUSTERING PROCESS INPUTS (THAT INCLUDES SET OF METRICS) UNTIL EACH CELL GROUP IS VALID

310 — GENERATE PRUNED SET OF CELLS BY PRUNING SELECT SET OF CELLS FROM EACH CELL GROUP IN PLURALITY OF CELLS GROUPS

312 — POST-PROCESS PLURALITY OF CELL GROUPS BY ADDING BACK ONE OR MORE CELLS, REMOVED FROM SET OF CELLS, TO PRUNED SET OF CELLS BASED ON ONE OR MORE CHARACTERISTICS OF ONE OR MORE CELLS

314 — PERFORM BUFFER INSERTION PROCESS ON CIRCUIT DESIGN BASED ON PRUNED SET OF CELLS

*FIG. 3*

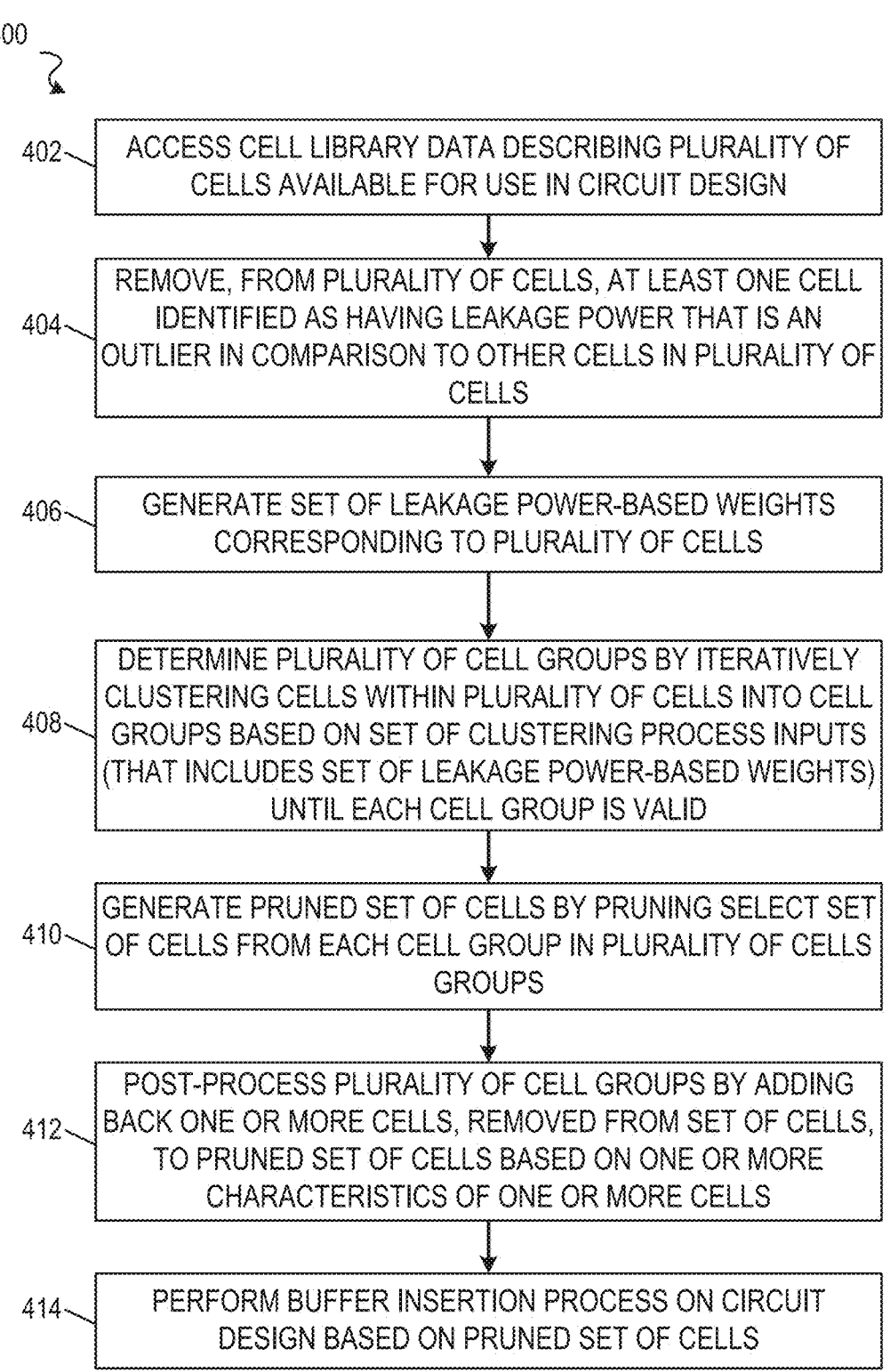

400

402 — ACCESS CELL LIBRARY DATA DESCRIBING PLURALITY OF CELLS AVAILABLE FOR USE IN CIRCUIT DESIGN

404 — REMOVE, FROM PLURALITY OF CELLS, AT LEAST ONE CELL IDENTIFIED AS HAVING LEAKAGE POWER THAT IS AN OUTLIER IN COMPARISON TO OTHER CELLS IN PLURALITY OF CELLS

406 — GENERATE SET OF LEAKAGE POWER-BASED WEIGHTS CORRESPONDING TO PLURALITY OF CELLS

408 — DETERMINE PLURALITY OF CELL GROUPS BY ITERATIVELY CLUSTERING CELLS WITHIN PLURALITY OF CELLS INTO CELL GROUPS BASED ON SET OF CLUSTERING PROCESS INPUTS (THAT INCLUDES SET OF LEAKAGE POWER-BASED WEIGHTS) UNTIL EACH CELL GROUP IS VALID

410 — GENERATE PRUNED SET OF CELLS BY PRUNING SELECT SET OF CELLS FROM EACH CELL GROUP IN PLURALITY OF CELLS GROUPS

412 — POST-PROCESS PLURALITY OF CELL GROUPS BY ADDING BACK ONE OR MORE CELLS, REMOVED FROM SET OF CELLS, TO PRUNED SET OF CELLS BASED ON ONE OR MORE CHARACTERISTICS OF ONE OR MORE CELLS

414 — PERFORM BUFFER INSERTION PROCESS ON CIRCUIT DESIGN BASED ON PRUNED SET OF CELLS

*FIG. 4*

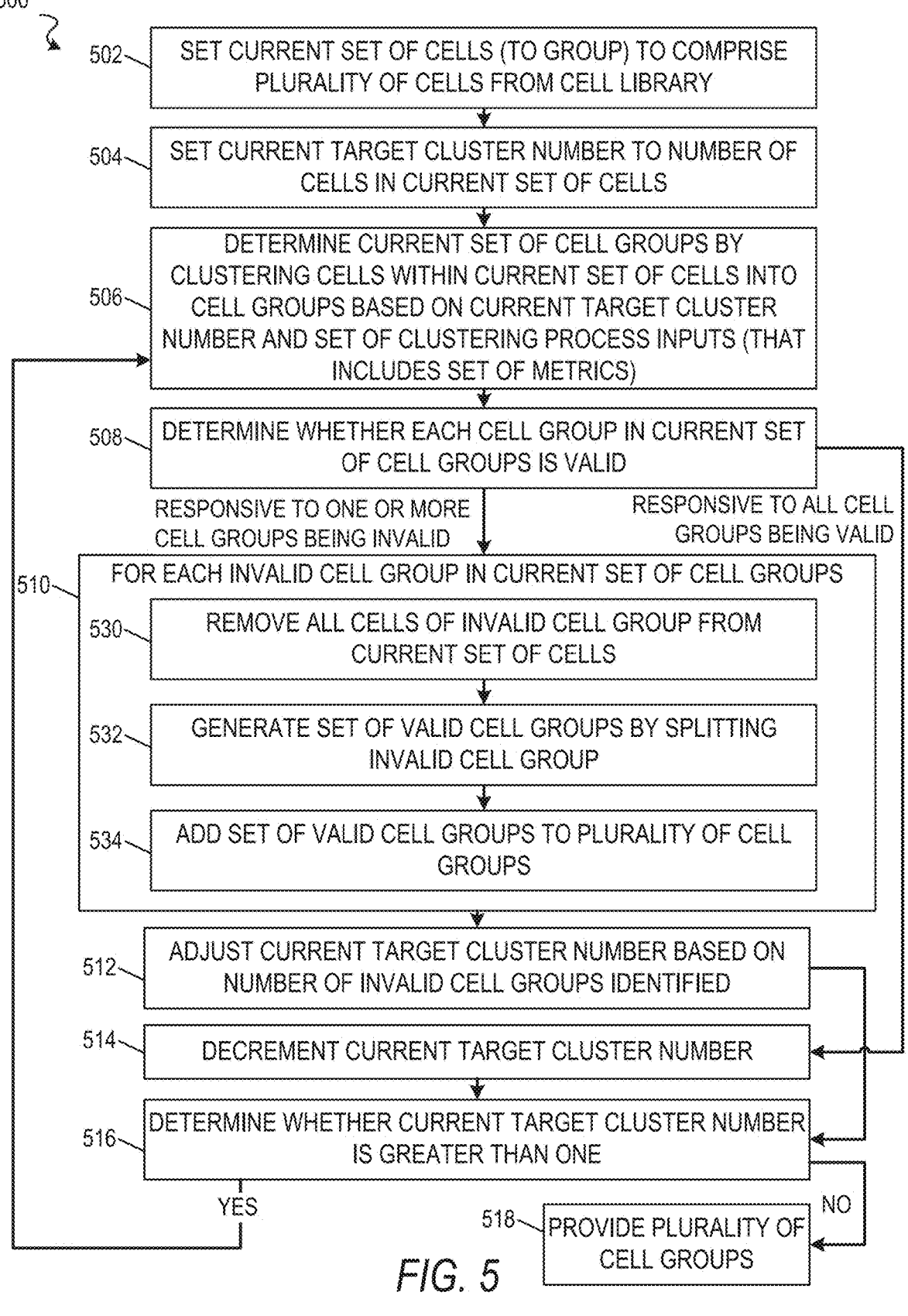

500

502 — SET CURRENT SET OF CELLS (TO GROUP) TO COMPRISE PLURALITY OF CELLS FROM CELL LIBRARY

504 — SET CURRENT TARGET CLUSTER NUMBER TO NUMBER OF CELLS IN CURRENT SET OF CELLS

506 — DETERMINE CURRENT SET OF CELL GROUPS BY CLUSTERING CELLS WITHIN CURRENT SET OF CELLS INTO CELL GROUPS BASED ON CURRENT TARGET CLUSTER NUMBER AND SET OF CLUSTERING PROCESS INPUTS (THAT INCLUDES SET OF METRICS)

508 — DETERMINE WHETHER EACH CELL GROUP IN CURRENT SET OF CELL GROUPS IS VALID

RESPONSIVE TO ONE OR MORE CELL GROUPS BEING INVALID

RESPONSIVE TO ALL CELL GROUPS BEING VALID

510 — FOR EACH INVALID CELL GROUP IN CURRENT SET OF CELL GROUPS

530 — REMOVE ALL CELLS OF INVALID CELL GROUP FROM CURRENT SET OF CELLS

532 — GENERATE SET OF VALID CELL GROUPS BY SPLITTING INVALID CELL GROUP

534 — ADD SET OF VALID CELL GROUPS TO PLURALITY OF CELL GROUPS

512 — ADJUST CURRENT TARGET CLUSTER NUMBER BASED ON NUMBER OF INVALID CELL GROUPS IDENTIFIED

514 — DECREMENT CURRENT TARGET CLUSTER NUMBER

516 — DETERMINE WHETHER CURRENT TARGET CLUSTER NUMBER IS GREATER THAN ONE

YES

518 — PROVIDE PLURALITY OF CELL GROUPS

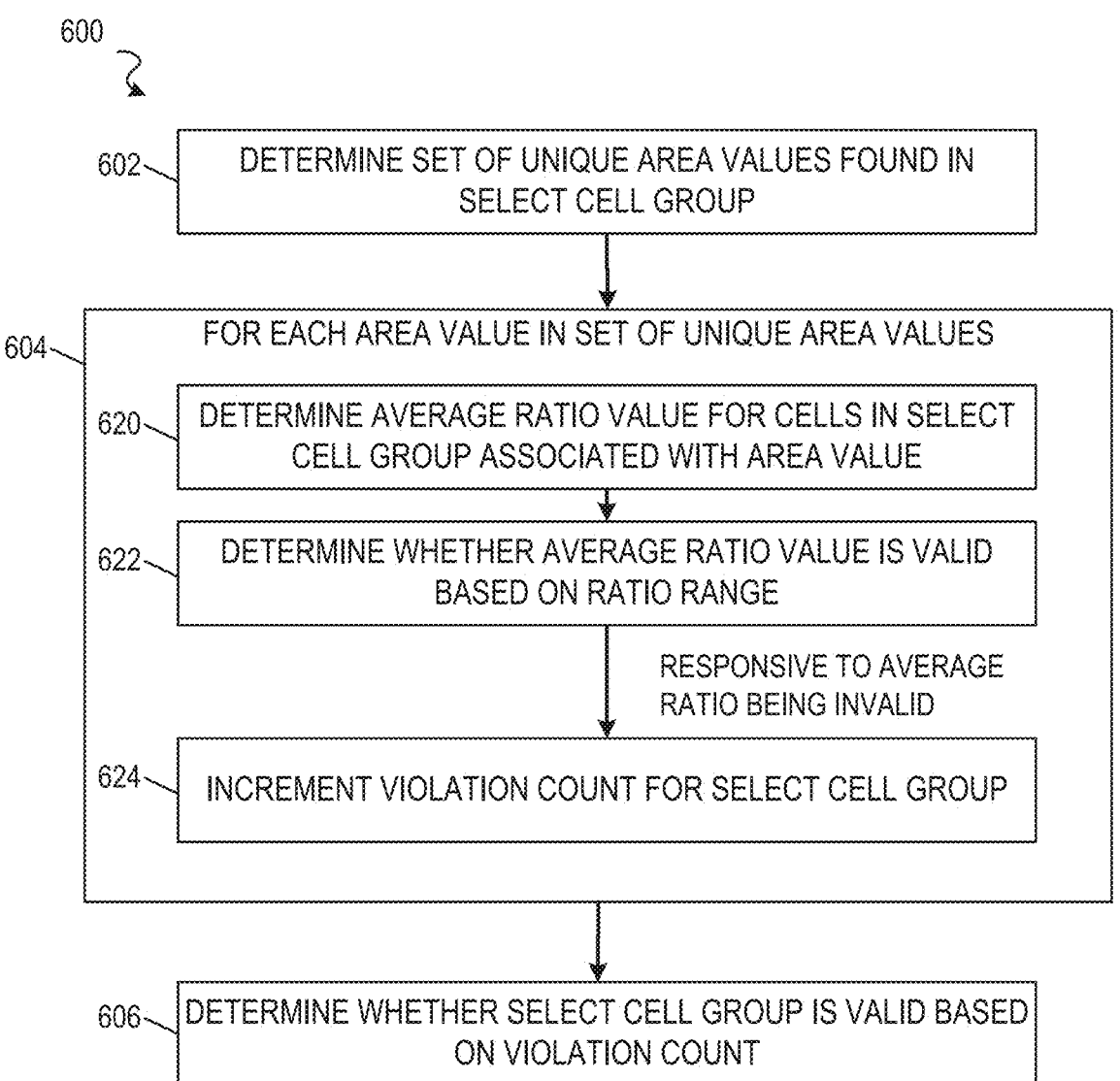

600

602 — DETERMINE SET OF UNIQUE AREA VALUES FOUND IN SELECT CELL GROUP

604 — FOR EACH AREA VALUE IN SET OF UNIQUE AREA VALUES

620 — DETERMINE AVERAGE RATIO VALUE FOR CELLS IN SELECT CELL GROUP ASSOCIATED WITH AREA VALUE

622 — DETERMINE WHETHER AVERAGE RATIO VALUE IS VALID BASED ON RATIO RANGE

RESPONSIVE TO AVERAGE RATIO BEING INVALID

624 — INCREMENT VIOLATION COUNT FOR SELECT CELL GROUP

606 — DETERMINE WHETHER SELECT CELL GROUP IS VALID BASED ON VIOLATION COUNT

SOFTWARE ARCHITECTURE 902

APPLICATIONS 910

CELL GROUPING BASED
ON ITERATIVE
CLUSTERING 942

FRAMEWORKS 908

LIBRARIES 906

| SYSTEM 930 | API 932 | OTHER 934 |

OPERATING SYSTEM 904

| KERNEL 920 | SERVICES 922 | DRIVERS 924 |

API CALLS 912

MESSAGES 914

MACHINE 1000

| PROCESSORS 1010 | MEMORY 1030 | I/O COMPONENTS 1050 |

GROUPING CELLS IN CELL LIBRARY BASED ON ITERATIVE CLUSTERING

TECHNICAL FIELD

Embodiments described herein relate to circuit design and, more particularly, to systems, methods, devices, and instructions for grouping cells in a cell library based on iterative clustering, which can be used for pruning the cell library.

BACKGROUND

Electronic design automation (EDA) software systems are commonly used to generate a circuit design that comprises one or more components or elements, also referred to as cells, which implement basic units of functionality within the circuit design. A given cell can represent a logical abstraction of one or more circuit design physical components/elements. Each cell can be defined within a library (e.g., cell library or technology library) that describes functionality (e.g., digital logic), input/output(s), parameters, and characteristics (e.g., area, power, delay, voltage threshold, etc.) of individuals cells. Based on a library definition, multiple instances of the given cell can be placed within a given circuit design. Cells within a library can be organized in families (e.g., voltage threshold). Additionally, a given library can be associated with one or more circuit (e.g., semiconductor) manufacturing technologies.

BRIEF DESCRIPTION OF THE DRAWINGS

Various ones of the appended drawings merely illustrate example embodiments of the present disclosure and should not be considered as limiting its scope.

FIGS. 2 through 6 are flowcharts illustrating example methods for grouping cells in a cell library based on iterative clustering, according to some embodiments.

DETAILED DESCRIPTION

Figure 1:
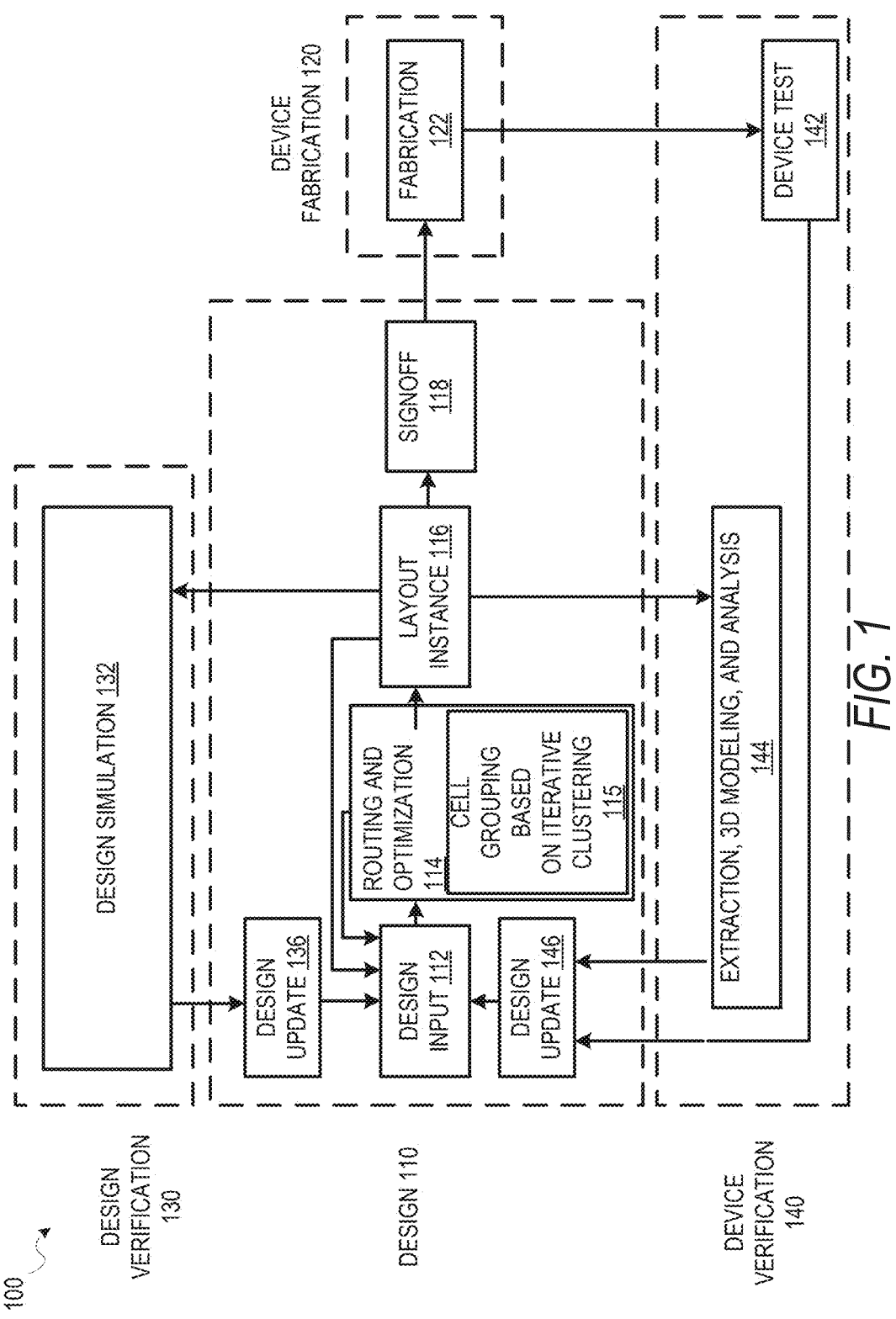
FIG. 1 is a diagram illustrating an example design process flow for grouping cells in a cell library based on iterative clustering, according to some embodiments.

Various embodiments provide for grouping cells in a cell library based on iterative clustering, which can be used for pruning the cell library (e.g., as part of EDA). In particular, various embodiments provide for grouping cells in a cell library based on iterative clustering in view of a criterion (or cell attribute) and for pruning of the cell library based on the grouping of cells, which can optimize the cell library for the criterion. For instance, some embodiments provide for grouping cells within a cell library based on iterative clustering of cells in view of a criterion (e.g., leakage power characteristic), where the iterative clustering uses a target cluster number that is determined via an iterative methodology (e.g., rather than using a fixed target cluster number or a target cluster number determined manually by a trial and error process). Cell library pruning can then be applied to the resulting grouping of cells, thereby optimizing the cell library for the criterion (e.g., leakage power characteristic).

For a circuit design that involves advanced technology nodes, the cell library used can be quite complex and can include hundreds of cells that have very different characteristics (e.g., area, power, delay, voltage threshold, etc.) A traditional approach to mitigating the complexity of the cell library is to perform a cell library pruning process (e.g., for a given circuit design task), which removes (or otherwise marks as unavailable) one or more cells within the cell library. For instance, for buffer/inverter insertion tasks, cell library pruning is commonly performed by considering both speed and area of individual cells (e.g., logic cells, inverter cells, non-buffer cells, buffer cells, and the like) to remove cells from the cell library. For example, where a circuit design is using ten cells from a cell library, four cells can be removed by a conventional cell library pruning process for buffer/inverter insertion, thereby leaving only six cells to be considered for buffer insertion, By performing cell library pruning prior to a buffer/inverter insertion task, the number of cells (in the cell library) that are considered for buffer/inverter insertion can be reduced.

Conventional methodologies for pruning cell libraries either treat all cells as one group to prune (e.g., performing speed and area-aware pruning directly on an entire cell library) or group cells based on voltage threshold, which represents discrete information for an individual cell. Unfortunately, such conventional methodologies do not consider leakage power or cells and, as a result, tend to prune cells that have good leakage power performance (e.g., which are usually slower than other cells in a cell library), thereby leaving cells (in the cell library) that have suboptimal leakage power performance. For instance, a conventional cell library pruning process that uses voltage threshold for cell grouping can be inaccurate because cells with a same or similar voltage threshold can have very different leakage power characteristics, while cells with different voltage thresholds (that are grouped separately based on their different voltage thresholds) can have the same or similar power leakage power characteristics. By pruning (e.g., removing) cells that have good leakage power performance from a cell library, conventional methodologies for cell library pruning can negatively impact a final power consumption of a circuit design (e.g., after buffer insertion).

According to various embodiments described herein, a cell library (e.g., without any grouping or classification) and a criterion or cell attribute that will be used to group the cells, such as leakage power or area to power ratio, are received as input. For some embodiments, the cell library is checked/validated to determine whether one or more cells (e.g., each cell) in the cell library has sufficient information to be clustering-based grouped based on the selected criterion/cell attribute. For an individual cell (e.g., each cell) in the cell library, various embodiments determine (e.g., compute) a metric for the criterion/cell attribute of the individual cell, where the metric is a representation of the criterion/cell attribute. For instance, where the criterion/cell attribute is leakage power, a metric for an individual cell can comprise leakage power of the individual cell divided by area of the individual cell. Thereafter, an embodiment can nap (e.g., normalize) the metric for the individual cell (which is one-dimensional (1D)) to two-dimension (2D) data. For instance, a metric for an individual cell can be 1D mapped by creating a 2D coordinate where x-axis value is a value of the metric, and where the y-axis value is set to a same, fixed value (e.g., zero) that is shared by all 1D-to-2D mapped metrics. In this way, a 2D location-based clustering algorithm or process can be applied to 1D-to-2D mapped metrics of individual cells in the cell library to group the individual cells. Some embodiments use a clustering algorithm (e.g., 2D location-based clustering algorithm) to cluster the cells of the cell library into one or more groups of cells based on the mapped metrics for those cells. Additionally, various embodiments, a plurality of cell groups is determined by iteratively clustering cells within the plurality of cells into cell groups based on a set of clustering process inputs until each cell group in the plurality of cell groups is valid, where the set of clustering process inputs includes the set of metrics (e.g., the set of leakage power-based weights) for the plurality of cells. For instance, the set of metrics can comprise metrics (e.g., 2D coordinates data) for individual cells after a 1D-to-2D mapping as described herein. Accordingly, the output (of the iterative clustering of cells) can be a cell library that is divided into a number of cell groups. Subsequently, some embodiments prune one or more cells from the cell library based on the one or more groups of cells produced. The pruning can be facilitated using an existing library pruning algorithm/process, such as an area and speed aware library pruning algorithm/process.

By use of various embodiments described herein, a custom metric (e.g., area to leakage ratio) can be used to improve grouping of cells when compared to using discrete information (e.g., voltage threshold families). An embodiment described herein can generate an iteratively-determined number of groups of cells based on a given criterion (e.g., one based on leakage power characteristics of cells). By using an iteratively-determined target cluster number (to generate the iteratively-determined number of groupings of cells), various embodiments avoid a manual process of setting a target cluster number, which can be time consuming, can result in sub-optimal cell grouping results, and can result in scalability issues. Use of some embodiments can facilitate pruning (e.g., reduction) of a cell library while preserving fast cells with different leakage power characteristics, which can affect leakage power consumption in a circuit design after buffer insertion.

For instance, some embodiments can divide a cell library into an iteratively-determined number of groups (e.g., an iteratively-determined target cluster number) while considering leakage power characteristics of each cell, which can improve pruning of the cell library prior to a circuit design process, such as a buffer insertion. The approach of some embodiments enable cells with good speed and good leakage power to be retained in the pruned cell library, thereby reducing the leakage power impact of traditional library pruning methods (e.g., ones used prior to a buffer insertion process, such as delay-area pruning).

As used herein, leakage power of an individual cell can represent a measurement of power used (e.g., leaked) by the cell when the cell is not active (e.g., not switching). Generally, the larger the leakage power of an individual cell, the more driving range the individual cell has, which can assist in fixing timing issues in a circuit design. For some embodiments, a cell library describes a leakage power (e.g., leakage power parameter or characteristic) for one or more cells of the cell library.

As used herein, cell library pruning (or library pruning) can comprise temporarily removing cells from a cell library, which can mitigate the runtime of a circuit design process that uses the cell library, such as a buffer insertion process. Generally, cell library pruning attempts to maintain the variety of cells within a cell library such that the optimality loss is minimized for the circuit design that is using the pruned cell library. The grouping of cells based on a metric as described herein can be helpful in cell library pruning.

Though various embodiments are described herein with respect to leakage power, some embodiments provide use of other criterion/cell attributes in achieving the iterative clustering-based grouping of cells described herein.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for grouping cells in a cell library based on iterative clustering, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input I 12 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. As shown, the routing and optimization 114 operation includes a cell grouping based on iterative clustering 115 operation, which may be performed in accordance with various embodiments described herein. The cell grouping based on iterative clustering 115 can group cells in a cell library based on iterative clustering as described herein. In particular, for some embodiments, the cell grouping based on iterative clustering 115 enables grouping of individual cells (in the cell library) by iteratively clustering those individual cells in view of metrics for those individual cells until each cell group that results is valid. For some embodiments, a metric represents a criterion/cell attribute of an individual cell, such as a metric (e.g., leakage power-based weight) based on leakage power of the individual cell. According to some embodiments, the grouping of cells described based on clustering herein can enable or facilitate improved pruning of a cell library (e.g., prior to performing a circuit design process on a circuit design). In various embodiments, the cell grouping based on iterative clustering 115 generates group cells in a cell library by iteratively clustering cells based on their respective metrics and prunes (or causes the pruning of) the cell library based on the cell groupings.

After design inputs are used in the design input 112 operation to generate a circuit layout, and any of the routing and optimization 114 operations are performed, a layout is generated in the layout instance 116. The layout describes the physical layout dimensions of the device that match the design inputs. Prior to this layout being provided to a fabrication 122 operation, a signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, three-dimensional (3D) modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

FIGS. 2 through 6 are flowcharts illustrating example methods for grouping cells in a cell library based on iterative clustering, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for grouping cells in a cell library based on iterative clustering, according to some embodiments. For some embodiments, the method 200 is performed prior to certain circuit design processes applied (e.g., by an EDA software system) to a circuit design, such as a buffer insertion process, where the process can benefit from cell library pruning. An operation of the method 200 (or another method described herein) may be performed by a hardware processor (e.g., central processing unit (CPU) or graphics processing unit (GPU) of a computing device (e.g., desktop, server, etc.).

As illustrated, operation 202 accesses cell library data describing a plurality of cells available for use in a circuit design. For various embodiments, the cell library data represents a cell library being used for the circuit design. For instance, the cell library data can represent a cell library (or technology library) specifically associated with the circuit design. As described herein, a cell can implement a basic unit of functionality within a circuit design and can represent a logical abstraction of one or more circuit design physical components/elements. The cell library can define one or more cells and can describe each cell's functionality (e.g., digital logic), input/output(s), parameters, and characteristics (e.g., area, power, delay, voltage threshold, etc.). For some embodiments, during operation 202, the cell library data is validated by checking that each cell described by the cell library data has sufficient information (e.g., leakage power information) to facilitate the intended cluster-based grouping of cells.

A set of metrics (e.g., leakage power-based weights or area-to-power ratio), corresponding to the plurality of cells described by the cell library data, is generated at operation 204. For some embodiments, the set of metrics is generated by determining a metric for each individual cell, in the plurality of cells, based on an attribute or characteristic (e.g., leakage power, area, power parameter, etc.) of the individual cell. Depending on the embodiment, the attribute/characteristic for a given cell can be provided by the cell library data accessed at operation 202. As described herein, a metric generated for an individual cell can represent a criterion being used (by the method 200) to cluster cells from cell library data into cell groups. The metric can be any custom (e.g., user-defined) criterion that can improve grouping over using just discrete information (e.g., voltage threshold (VT) family information). Depending on the embodiment, the metric can comprise a leakage power-based weight or an area-to-power ratio.

At operation 206, a plurality of cell groups is determined for the one or more cells of the cell library data accessed at operation 202. For some embodiments, the plurality of cell groups is determined by iteratively clustering cells within the plurality of cells into cell groups based on a set of clustering process inputs until each cell group in the plurality of cell groups is valid, where the set of clustering process inputs include the set of metrics determined at operation 204. For some embodiments, each individual cell group is determined to be valid by checking a similarity of cells of the individual cell group. According to some embodiments, operation 204 comprises setting (e.g., initializing) a current set of cells that is to be grouped to comprise the plurality of cells, and setting (e.g., initializing) a current target cluster number to a number of cells in the current set of cells. Additionally, some embodiments then iteratively perform a set of operations while a size of the current set of cells (that is to be grouped) is greater than one cell, where the set of operations include: determining a current set of cell groups by clustering cells within the current set of cells into cell groups based on the current target cluster number and the set of clustering process inputs; and determining whether each cell group in the current set of cell groups is valid. In response to determining that each cell group in the current set of cell groups is valid, an embodiment can decrement the current target cluster number.

Alternatively, in response to determining that one or more cell groups in the current set of cell groups are invalid, an embodiment can perform the following operations for each invalid cell group in the current set of cell groups: removing all cells of the invalid cell group from the current set of cells; generating a set of valid cell groups by splitting the invalid cell group into the set of valid cell groups (e.g., such that each cell in the invalid cell group forms a single-cell cell group); and adding the set of valid cell groups to the plurality of cell groups. Thereafter, some such embodiments adjust the current target cluster number based on a number of invalid cell groups identified. FIG. 5 illustrates an example method for performing operation 206, and FIG. 6 illustrates an example method for determining whether an individual cell group is valid.

The plurality of cell groups resulting from operation 206 can represent the cell library data divided into a number of groups equal to a cluster number determined during the iterative clustering process. For various embodiments, clustering cells within the plurality of cells into cell groups, based on the set of metrics (in the set of clustering process inputs) corresponding to the plurality of cells, comprises performing a clustering process on the plurality of cells, where the clustering process clusters cells in close proximity to each other based on to their respective metric.

For operation 206, the clustering process used to cluster cells within the current set of cells into cell groups (based on the current target cluster number and the set of clustering process inputs) can be one that accepts (or is configured to receive) as inputs the current target cluster number and the set of clustering process inputs, which includes the set of metrics. According to some embodiments, the clustering process is configured to accept (or receive) the current target cluster number and a 2D input (e.g., X and Y coordinates) for individual points, where each point is intended to represent a metric of a cell in a 2D space. As such, for some embodiments, the set of clustering process inputs is generated based on the set of metrics (as part of or prior to operation 206) by generating (e.g., mapping) a corresponding 2D input (e.g., generating a 2D point) for each metric (e.g., each leakage power-based weight) in the set of metrics (e.g., the set of leakage power-based weights), where a value of a first dimension of the corresponding 2D input is set to a value of the individual metric of the individual cell, and a value of a second dimension of the corresponding 2D input is set to a fixed value (such as 0). For instance, a metric of each cell can be mapped to a point (X, 0), where X represents the value of the metric (e.g., value of the leakage power-based weight) and 0 is the fixed value on the Y-axis. In another instance, a metric of each cell can be mapped to a point (0, Y), where Y represents the value of the metric (e.g., value of the leakage power-based weight) and 0 is the fixed value on the X-axis. In this way, the individual metric of the individual cell can be mapped (or normalized) from a 1D space to a 2D space to facilitate use by a clustering process. For instance, the clustering process can comprise a clustering package that groups (x, y) points using a 2D distance. Given a set of points and the current target number of clusters (e.g., N), the package can create N clusters in which the points (which represent individual cells) can be classified. Other cluster processes can be used by an embodiment, such as a K-means clustering process.

Eventually, at operation 208, a pruned set of cells is generated by pruning a select set of cells from each cell group in the plurality of cells groups determined at operation 206. In various embodiments, the pruned set of cells represents a pruned version of the cell library data accessed at operation 202. For some embodiments, the pruning the select set of cells from each cell group (in the plurality of cell groups) comprises performing a traditional pruning process (e.g., delay-area pruning process) on each individual cell group in the plurality of cell groups.

Referring now to FIG. 3, the flowchart illustrates an example method 300 for grouping cells in a cell library based on iterative clustering, according to some embodiments. Like the method 200 of FIG. 2, the method 300 may be performed prior to certain circuit design processes (such as a buffer insertion process) applied to a circuit design that can benefit from cell library pruning. An operation of the method 300 may be performed by a hardware processor.

As shown, operation 302 accesses cell library data describing a plurality of cells available for use in a circuit design. For various embodiments, operation 302 is similar to operation 202 of the method 200 described with respect to FIG. 2.

One or more cells, identified as having at least one cell attribute/characteristic (e.g., area, speed, or leakage power) that is an outlier in comparison to other cells in the plurality of cells, can be removed from the plurality of cells at operation 304. The cell attribute/characteristic in question can be one that renders the identified at least one cell undesirable for retention in the cell library data. Operation 304 can represent pre-processing of cells of the cell library data to remove individual cells having dominant (e.g., outlier) characteristics/attributes that would be detrimental for use in the circuit design. Operation 304 can remove a cell if, for example, the cell's area, speed, and leakage power are all dominated by another cell (e.g., the cell's area, speed, and leakage power are all worse than or equal to another cell). For example, where cell A has an area of 5 micron$^2$, speed of 10 micron/picosecond, and leakage power of 15 nW, and cell B has area of 8 micron$^2$, speed of 10 micron/picosecond, and leakage power of 16 mW, an embodiment can consider cell B to be dominated by cell A and, as a result, the embodiment can prune cell B at operation 304.

The method 300 comprises operations 306, 308, 310, which according to some embodiments, are respectively similar to operations 204, 206, 208 of the method 200 described above with respect to FIG. 2. After the pruning at operation 310, the plurality of cell groups is post-processed at operation 312 by adding one or more cells, removed from the set of cells (e.g., by operation 304, operation 310, or both), back to the pruned set of cells based on one or more characteristics of the one or more cells. The one or more characteristics can include a characteristic not associated with a cell attribute/characteristic used by operation 304 or by operation 306. For instance, the one or more characteristics can include a largest maximum load capacity characteristic, a smallest input capacity characteristic, or a characteristic that assists in fixing either a design rule violation (DRV) or a timing issue of the circuit design.

Eventually, at operation 314, a circuit process, such as a buffer insertion process, is performed on the circuit design based on the pruned set of cells (e.g., after operation 310 or after post-processing by operation 312).

Referring now to FIG. 4, the flowchart illustrates an example method 400 for grouping cells in a cell library based on iterative clustering, according to some embodiments. Like the method 200 of FIG. 2, the method 400 may be performed prior to certain circuit design processes (such as a buffer insertion process) applied to a circuit design that can benefit from cell library pruning. An operation of the method 400 may be performed by a hardware processor.

As shown, the method 400 comprises operations 402 and 404, which according to some embodiments are respectively similar to operations 302 and 304 of the method 300 described with respect to FIG. 3. At operation 406, a set of leakage power-based weights, corresponding to the plurality of cells described by the cell library data, is generated. For some embodiments, the set of leakage power-based weights is generated by determining an individual leakage power-based weight for each individual cell, in the plurality of cells, based on a leakage power parameter of the individual cell. Depending on the embodiment, the leakage power parameter for a given cell can be provided by the cell library data accessed at operation 402. For some embodiments, the leakage power-based weight of the individual cell is generated by dividing a leakage power value for the individual cell by an area of the individual cell. As described herein, a leakage power-based weight generated for an individual cell can represent a leakage power criterion being used (by the method 400) to cluster cells from cell library data into cell groups.

At operation 408, a plurality of cell groups is determined for the one or more cells of the cell library data accessed at operation 402. For some embodiments, the plurality of cell groups is determined by iteratively clustering cells within the plurality of cells into cell groups based on a set of clustering process inputs until each cell group in the plurality of cell groups is valid, where the set of clustering process inputs includes the set of leakage power-based weights determined at operation 406. For some embodiments, each individual cell group is determined to be valid by checking a similarity of cells of the individual cell group. According to some embodiments, operation 204 comprises setting (e.g., initializing) a current set of cells that is to be grouped to comprise the plurality of cells, and setting (e.g., initializing) a current target cluster number to a number of cells in the current set of cells. Additionally, some embodiments then iteratively perform a set of operations while a size of the current set of cells (that is to be grouped) is greater than one cell, where the set of operations includes: determining a current set of cell groups by clustering cells within the current set of cells into cell groups based on the current target cluster number and the set of clustering process inputs; and determining whether each cell group in the current set of cell groups is valid. In response to determining that each cell group in the current set of cell groups is valid, an embodiment can decrement the current target cluster number. Alternatively, in response to determining that one or more cell groups in the current set of cell groups are invalid, an embodiment can perform the following operations for each invalid cell group in the current set of cell groups: removing all cells of the invalid cell group from the current set of cells; generating a set of valid cell groups by splitting the invalid cell group into the set of valid cell groups; and adding the set of valid cell groups to the plurality of cell groups. Thereafter, some such embodiments adjust the current target cluster number based on a number of invalid cell groups identified. FIG. 5 illustrates an example method for performing operation 206, FIG. 6 illustrates an example method for determining whether an individual cell group is valid.

The plurality of cell groups resulting from operation 408 can represent the cell library data divided into a number of groups equal to a cluster number determined during the iterative clustering process. For various embodiments, clustering cells within the plurality of cells into cell groups, based on the set of leakage power-based weights (in the set of clustering process inputs) corresponding to the plurality of cells, comprises performing a clustering process on the plurality of cells, where the clustering process clusters cells in close proximity to each other based on their leakage power-based weight.

The method 400 comprises operations 410, 412, 414, which according to some embodiments are respectively similar to operations 310, 312, 314 of the method 300 described with respect to FIG. 3.

Referring now to FIG. 5, the flowchart illustrates an example method 500 for determining a plurality of cell groups for a cell library by iteratively clustering cells within the plurality of cells, according to some embodiments. For some embodiments, the method 500 is used, at least in part, to perform one of operations 206 of the method 200, operation 308 of the method 300, and operation 408 of the method 400. As shown, at operation 502, a current set of cells that is to be grouped is set (e.g., initialized) to comprise the plurality of cells and, at operation 504, a current target cluster number is set (e.g., initialized) to a number of cells in the current set of cells. The current set of cells can represent a clustering problem being solved by the method 500. For the method 500, before operation 506 is performed (e.g., at the beginning of the method 500), the plurality of cell groups is initialized (e.g., initially generated) to be empty.

Thereafter, the method proceeds to operation 506. Operations 506 through 516 represent the operations of iteratively clustering cells based on a set of clustering process inputs (which includes a set of metrics, such as a set of leakage power-based weights) until each cell group in the plurality of cell groups is valid. At operation 506, a current set of cell groups is determined by clustering cells within the current set of cells (initially set by operation 502) into cell groups based on the current target cluster number (initially set by operation 504) and the set of clustering process inputs (e.g., determined by operation 204 of the method 200, operation 306 of the method 300, operation 406 of the method 400) corresponding to the current set of cells. As described herein, clustering cells within the current set of cells into cell groups based on the current target cluster number and the set of clustering process inputs corresponding to the current set of cells comprises performing a clustering process on the current set of cells, where the clustering process clusters cells in close proximity to each other based on their respective metric. For instance, the clustering process can comprise a clustering package that groups $(x, y)$ points using a 2D distance. Given a set of points and the current target number of clusters (e.g., N), the package can create N clusters into which the points (which represent individual cells) can be classified. Other cluster processes can used by an embodiment, such as a K-means clustering process.

Subsequently, operation 508 determines whether each cell group in the current set of cell groups (determined by operation 506) is valid. In doing so, all invalid cell groups in the current set of cell groups are identified by operation 508. In response to determining (by operation 508) that all cell groups in the current set of cell groups are valid, the method 500 proceeds to operation 514, otherwise the method 500 proceeds to operation 510. Operation 514 decrements the current target number (e.g., by 1) and the method 500 proceeds to operation 516.

At operation 510, operations 530 through 534 are performed for each cell group, in the current set of cells groups, that is invalid. With operation 530, all cells of the invalid cell group are removed from the current set of cells. By operation 530, all cells of the invalid cell group are removed from the clustering problem being solved by the method 500. Operation 532 generates a set of valid cell groups by splitting (up) the invalid cell group into the set of valid cell groups (e.g., two valid cell groups). In doing so, the invalid cell group can be reverted back to the cell groups (e.g., reverted back to the two cell groups) from previous clustering, which were known to be valid. Thereafter, operation 534 adds the set of valid cell groups to the plurality of cells groups. By operation 534, each valid cell group can be treated as part of the (final) plurality of cell groups.

After operation 510, operation 512 adjusts the current target cluster number based on a number of invalid cell groups identified by operation 508. For instance, the current target cluster number can be decremented by the sum of the number of invalid cell groups and a value of one (e.g., the current target cluster number=the current target cluster number−number of invalid cell groups−1). The method 500 proceeds to operation 516 after operation 512. Alternatively, for some embodiments, operation 512 is performed prior to operation 510 being performed, and the method 500 proceeds to operation 516 after operation 510.

Operation 516 determines whether the current target cluster number is greater than one. In response to the current target cluster number being greater than one, the method 500 returns to operation 506, otherwise the method 500 proceeds to operation 518. Alternatively, for some embodiments, operation 516 determines whether the current target cluster number is equal to one, and the method 500 proceeds to operation 518 in response to the current target cluster number equaling one; otherwise the method 500 returns to operation 506. Operation 518 provides the plurality of cell groups at its current state. For some embodiments, the plurality of cell groups provided by operation 518 represents a final solution to the clustering problem being solved by the method 500.

FIG. 6 illustrates an example method for determining whether an individual cell group is valid, according to some embodiments. For some embodiments, the method 600 is used, at least in part, to perform one of operations 206 of the method 200, operation 308 of the method 300, and operation 408 of the method 400. Additionally, for some embodiments, the method 600 is used, at least in part, to perform operation 508 of the method 500. As shown, operation 602 determines a set of unique area values (e.g., area steps) found in the individual cell group (for which validity is being determined). For some embodiments, a violation count for the individual cell group is initialized (e.g., set to 0) at the beginning of the method 600 (e.g., prior to or right after operation 602). For some embodiments, a violation threshold value (e.g., max violation count) is determined (e.g., accessed or set) at the beginning of the method 600 (e.g., prior to or right after operation 602). For instance, the violation threshold value can be one set by a user (e.g., identified by the user using trial and error). Additionally, for some embodiments, a violation ratio threshold value is determined (e.g., accessed or set) at the beginning of the method 600 (e.g., prior to or right after operation 602). For instance, the violation ratio threshold value can be one set by a user (e.g., identified by the user using trial and error).

At operation 604, operations 620 through 624 are performed for each area value (e.g., area step) in the set of unique area values (e.g., area steps). Operation 620 determines (e.g., computes or calculates) an average ratio value (e.g., power-to-area ratio value) for cells in the individual cell group associated with the area value (e.g., area step). Operation 622 determines whether the average ratio value is valid based on a ratio range (e.g., valid ratio range) for the average ratio value. For some embodiments, operation 622 comprises determining (e.g., computing or calculating) the ratio range for the average ratio value (e.g., for the cells in the individual cell group) based on the average ratio value (determined by operation 620) and a threshold value (e.g., violation ratio threshold value). For some embodiments, for an average ratio A and a threshold value Z (e.g., violation ratio threshold value Z), the ratio range is determined to be $[(A-(A*Z)), (A+(A*Z))]$. For instance, where the average ratio is 19.5 and the violation ratio threshold value is 50% (0.50), the ratio range is determined to be [9.16, 27.5]. During operation 622, the average ratio value (for cells in the individual cell group) can be determined to be valid in response to the average ratio value falling within the ratio range, and the average ratio value (for cells in the individual cell group) can be determined to be invalid in response to the average ratio value not falling within (e.g., falling outside) the ratio range.

In response to the average ratio value (for cells in the individual cell group) being determined (at operation 622) to be valid based on the ratio range, nothing is done and operations 620 and 622 are performed for the next area value (e.g., area step) in the set of unique area values (e.g., area steps). In response to the average ratio value being determined (at operation 622) to be invalid based on the ratio range, operation 624 increments a violation count for the individual cell group. For instance, operation 624 can increment the violation count for the individual cell group by one.

After operation 604, the method 600 proceeds to operation 606. At operation 606, the individual cell group is determined to be valid (or invalid) based on the (current) violation count. For instance, in response to the violation count surpassing (e.g., being greater than) the violation threshold value (e.g., max violation count), the individual cell group can be determined to be invalid. Alternatively, in response to the violation count not surpassing (or being equal to) the violation threshold value (e.g., max violation count), the individual cell group can be determined to be valid.

Table 1 (below) describes an example individual cell group that can be checked for validity by the method 600, where the individual cell group comprises {A, B C, D, E, F, G}.

TABLE 1

| CELL | AREA | LEAKAGE | POWER-TO-AREA RATIO |
|------|------|---------|---------------------|
| A | 1 | 10 | 10 |
| B | 1 | 20 | 20 |
| C | 1 | 25 | 25 |
| D | 2 | 22 | 11 |
| E | 2 | 35 | 17.5 |
| F | 2 | 60 | 30 |
| G | 3 | 36 | 12 |

For Table 1, there are three area values (e.g., area steps) identified: 1, 2, and 3. Cell group {A, B, C} are associated with area step 1, cell group {D, E, F} are associated with area step 2, and cell group {G} is associated with area step 3. For area step 1 and cell group {A, B, C}, the average power-to-area ratio (the average ratio) is determined to be 18.33, and the valid ratio range can be determined to be [9.16, 27.5] based on a violation ratio threshold of 50% (0.50), In view of this, the method 600 can determine all of cells {A, B, C} to be valid. For area steps 2 and cell group {D, E, F}, the average ratio is determined to be 19.5, and the valid ratio range can be determined to be [9.75, 29.25] based on a violation ratio threshold of 50% (0.50). In view of this, the method 600 can determine that cell F is invalid based on its ratio of 30 falling outside the [9.75, 29.25] range, and the method 600 can increment the violation count by 1. For area step 3 and cell group {G}, the method 600 can skip cell group {G} based on the cell group only containing one cell. Based on the violation count being 1, if the violation count is fewer than the violation count threshold value (e.g., set to 2), the individual cell group (comprising {A, B, C, D, E, F, G}) can be determined to be valid by the method 600.

Figure 7:
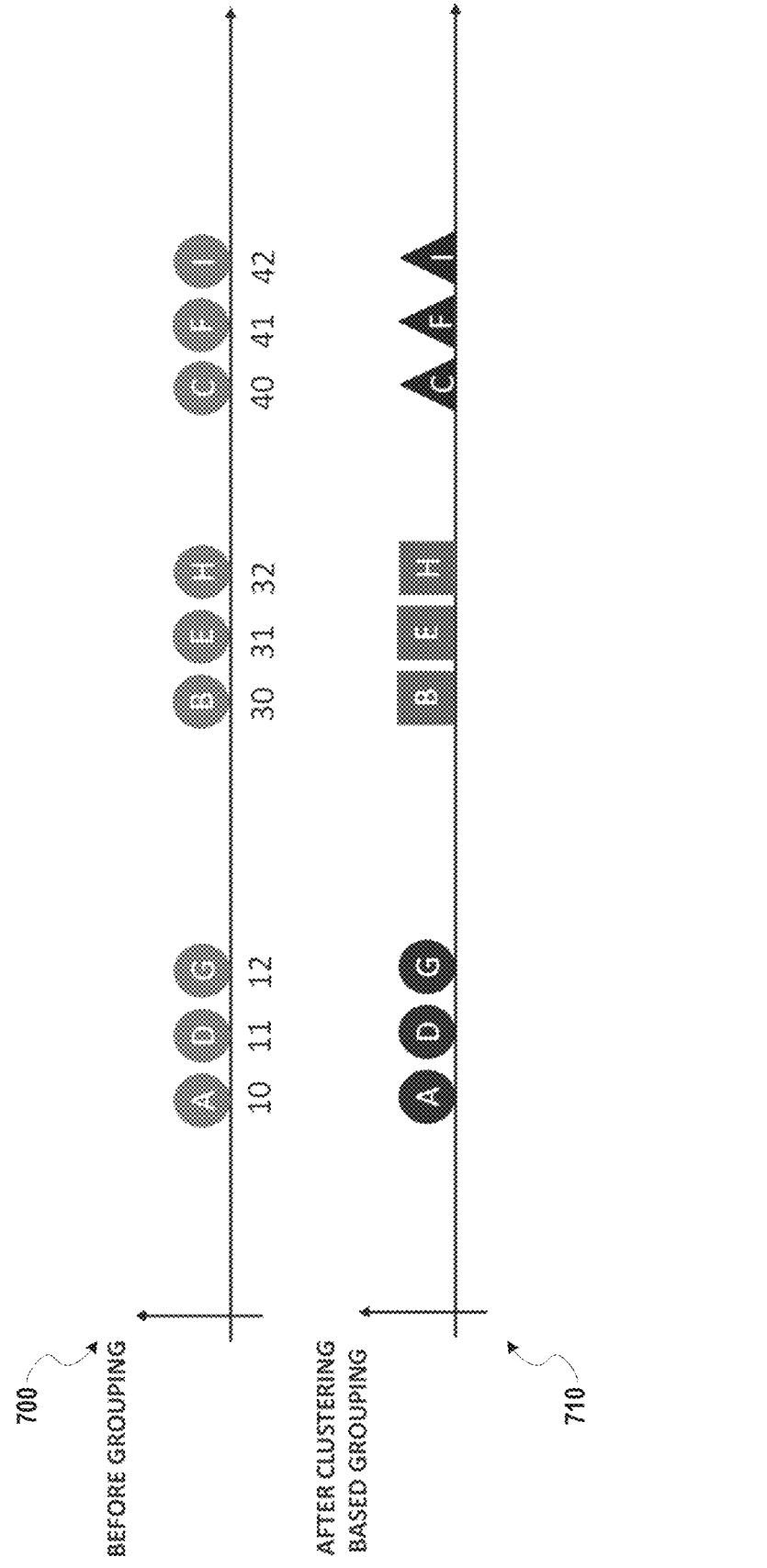
FIG. 7 presents a diagram illustrating an example clustering-based grouping of cells in a cell library, according to some embodiments.

FIG. 7 presents a diagram illustrating an example clustering-based grouping of cells in a cell library, according to sone embodiments. As shown, graph 700 illustrates the cells of Table 2 (below) before grouping by an embodiment, and graph 710 illustrates the cells of Table 2 after grouping by an embodiment. Table 2 describes an example plurality of cells of a cell library.

TABLE 2

| CELL | AREA | LEAKAGE | POWER-TO-AREA RATIO |
|------|------|---------|---------------------|
| A | 1 | 10 | 10 |
| B | 1 | 30 | 30 |
| C | 1 | 40 | 40 |
| D | 2 | 22 | 11 |
| E | 2 | 62 | 31 |
| F | 2 | 82 | 41 |
| G | 3 | 36 | 12 |
| H | 3 | 96 | 32 |
| I | 3 | 126 | 42 |

In graph 700, the cells of Table 2 are generally organized based on power-to-area ratio. In graph 710, the cells of Table 2 have been grouped into three clusters (A, D, G), (B, E, H), and (C, F, I) based on those cells' respective leakage power-based weights, which can be generated (e.g., computed) for an individual cell by dividing leakage power of the individual cell by a ratio of the individual cell.

Figure 8:
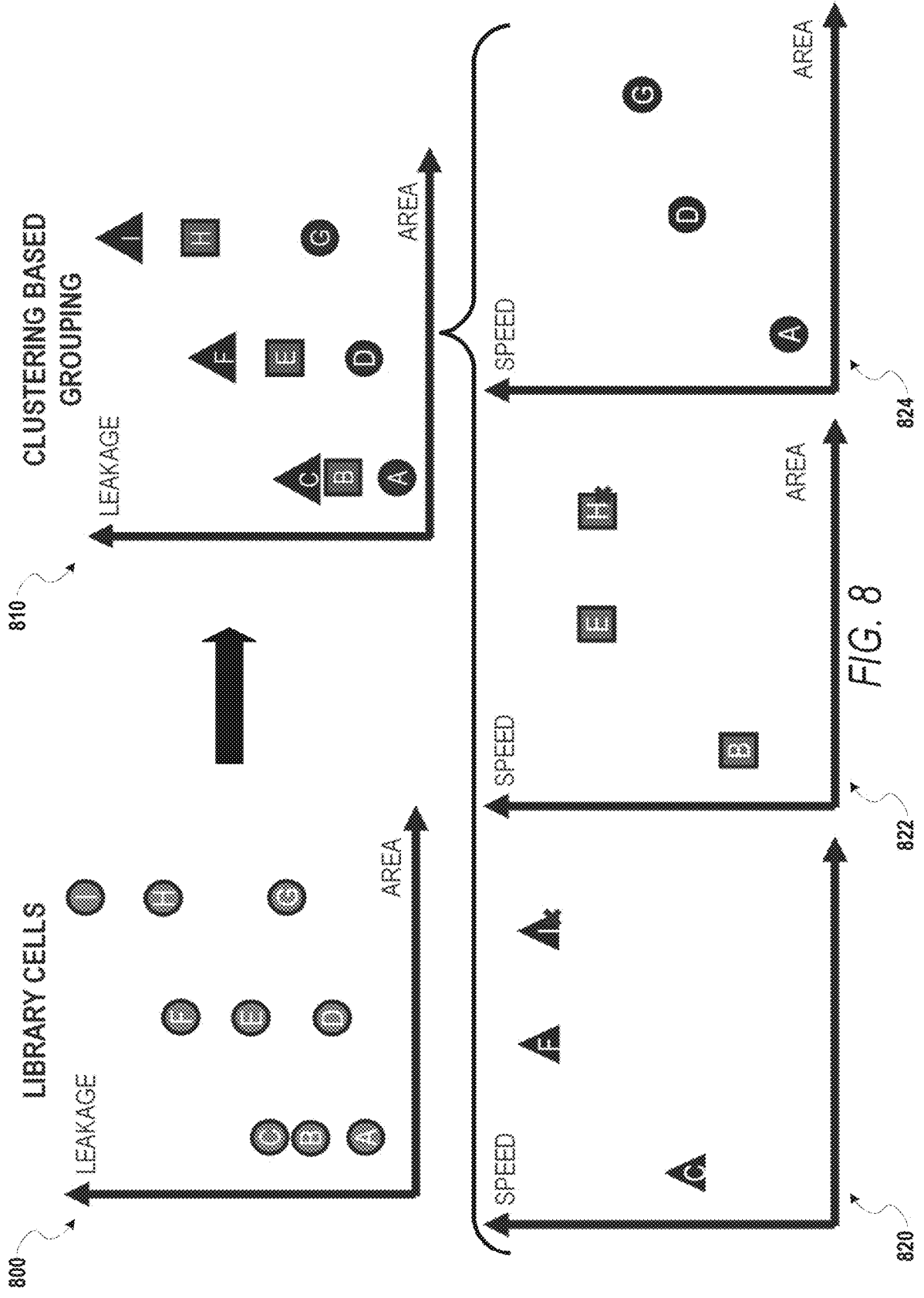
FIG. 8 presents diagrams illustrating an example clustering-based grouping of cells of a cell library and pruning process, according to some embodiments.

FIG. 8 presents diagrams illustrating an example clustering-based grouping of cells of a cell library and pruning process, according to some embodiments. In particular, graph 800 illustrates cells A through I of a cell library in terms of their respective leakage power and area characteristics (e.g., as described by the cell library data). Graph 810 illustrates the grouping of cells (A, D, G), (B, E, H), and (C, F, I) based on iteratively clustering (and reaching a target cluster number of 3) in view of leakage power-based weights as described herein. According to various embodiments, a pruning process (e.g., delay-area pruning process) is applied to each of the groupings of cells that results from the clustering described herein. Graph 820 illustrates the result of applying the pruning process to the grouping of cells (C, F, I), graph 822 illustrates the result of applying the pruning process to the grouping of cells (B, E, H), and graph 824 illustrates the result of applying the pruning process to the grouping of cells (A, D, G). As shown in graphs 820 and 822, the pruning process results in cell I and cell H being pruned (e.g., removed), while the grouping of cells (A, D, G) is retained. As a result, the pruned cell library that results comprises cells A, D, G, B, E, C, and F.

Figure 9:
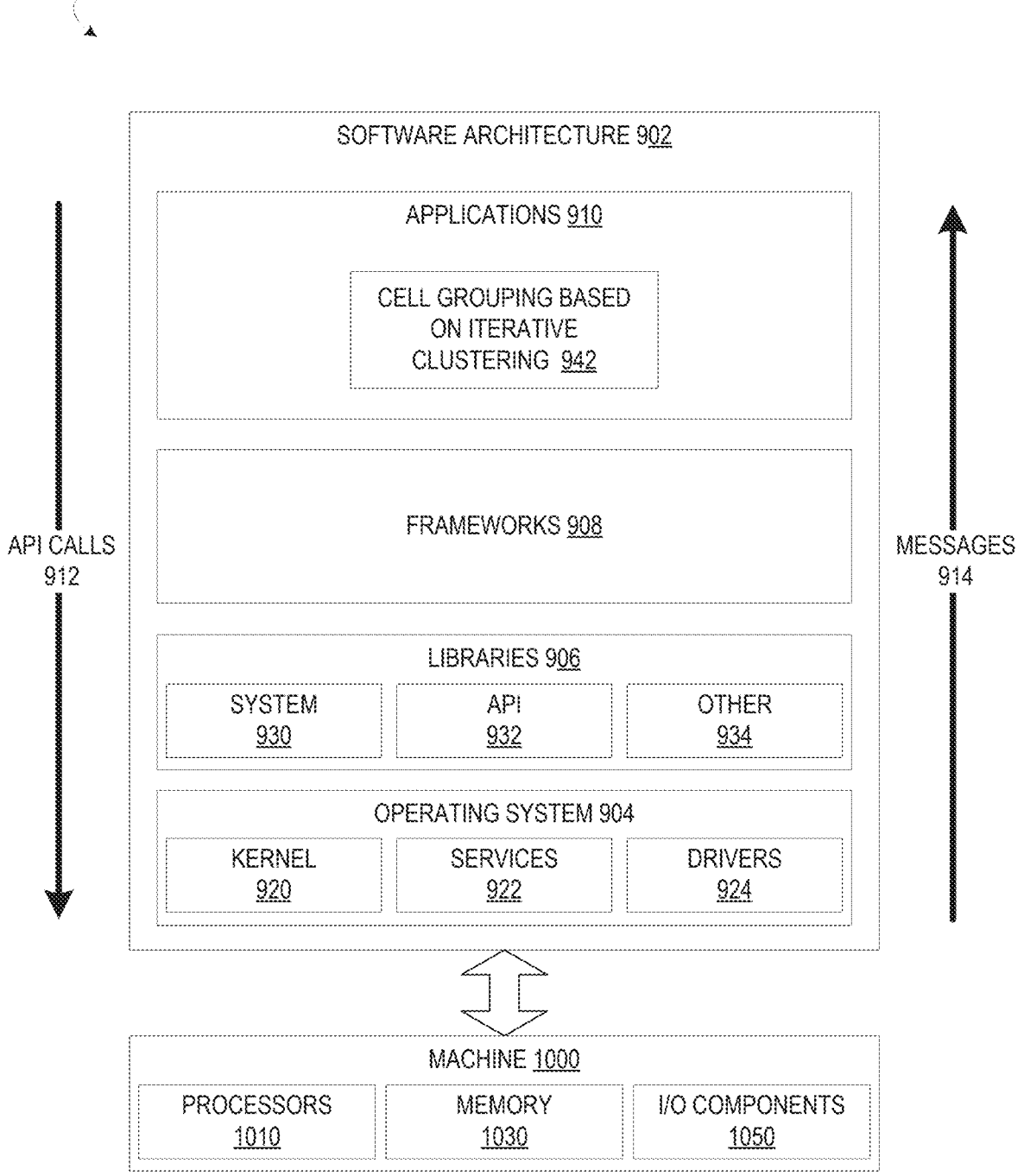
FIG. 9 is a block diagram illustrating an example of a software architecture that may be operating on an EDA computing device and may be used with methods for grouping cells in a cell library based on iterative clustering, according to some embodiments.

FIG. 9 is a block diagram 900 illustrating an example of a software architecture 902 that may be operating on an EDA computer and may be used with methods for grouping cells in a cell library based on iterative clustering, according to some example embodiments. The software architecture 902 can be used as an EDA computing device to implement any of the methods described above. Aspects of the software architecture 902 may, in various embodiments, be used to store circuit designs, and to use grouping cells in a cell library (for cell library pruning) based on iterative clustering in an EDA environment to generate circuit designs, from which physical devices may be generated.

FIG. 9 is merely a non-limiting example of a software architecture 902, and it will be appreciated that many other architectures can be implemented to facilitate the functionality described herein. In various embodiments, the software architecture 902 is implemented by hardware such as a machine 1000 of FIG. 10 that includes processors 1010, memory 1030, and input/output (I/O) components 1050. In this example, the software architecture 902 can be conceptualized as a stack of layers where each layer may provide a particular functionality. For example, the software architecture 902 includes layers such as an operating system 904, libraries 906, software frameworks 908, and applications 910. Operationally, the applications 910 invoke application programming interface (API) calls 912 through the software stack and receive messages 914 in response to the API calls 912, consistent with some embodiments. In various embodiments, any client device, any server computer of a server system, or any other device described herein may operate using elements of the software architecture 902. An EDA computing device described herein may additionally be implemented using aspects of the software architecture 902, with the software architecture 902 adapted to perform grouping cells in a cell library based on iterative clustering in any manner described herein.

In one embodiment, an FDA application of the applications 910 performs grouping cells in a cell library based on iterative clustering according to embodiments described herein using various modules within the software architecture 902. For example, in one embodiment, an EDA computing device similar to the machine 1000 includes the memory 1030 and the one or more processors 1010. The processors 1010 also implement a cell grouping based on iterative clustering module 942 for grouping cells in a cell library based on iterative clustering, in accordance with various embodiments described herein.

In various other embodiments, rather than being implemented as modules of the one or more applications 910, the cell grouping based on iterative clustering module 942 may be implemented using elements of the libraries 906, the operating system 904, or the software frameworks 908.

In various implementations, the operating system 904 manages hardware resources and provides common services. The operating system 904 includes, for example, a kernel 920, services 922, and drivers 924. The kernel 920 acts as an abstraction layer between the hardware and the other software layers, consistent with some embodiments. For example, the kernel 920 provides memory management, processor management (e.g., scheduling), component management, networking, and security settings, among other functionalities. The services 922 can provide other common services for the other software layers. The drivers 924 are responsible for controlling or interfacing with the underlying hardware, according to some embodiments. For instance, the drivers 924 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 906 provide a low-level common infrastructure utilized by the applications 910. The libraries 906 can include system libraries 930 such as libraries of blocks for use in an EDA environment or other libraries that can provide functions such as memory allocation functions, string manipulation functions, mathematic functions, and the like. In addition, the libraries 906 can include API libraries 932 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions and three dimensions in a graphic context on a display), database libraries (e.g., SQLite to provide various relational database functions), web libraries (e.g., WebKit to provide web browsing functionality), and the like. The libraries 906 may also include other libraries 934.

The software frameworks 908 provide a high-level common infrastructure that can be utilized by the applications 910, according to some embodiments. For example, the software frameworks 908 provide various graphic user interface (GUI) functions, high-level resource management, high-level location services, and so forth. The software frameworks 908 can provide a broad spectrum of other APIs that can be utilized by the applications 910, some of which may be specific to a particular operating system 904 or platform. In various embodiments, the systems, methods, devices, and instructions described herein may use various files, macros, libraries, and other elements of an EDA design environment to implement grouping cells in a cell library based on iterative clustering as described herein. This includes analysis of input design files for an integrated circuit design, along with any element of hierarchical analysis that may be used as part of or along with the embodiments described herein. While netlist files, library files, design constraint files, and view definition files are examples that may operate within the software architecture 902, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. The methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1000 including processors 1010), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 1000, but deployed across a number of machines 1000. In some example embodiments, the processors 1010 or processor-implemented modules are located in a single geographic location (e.g., within a home environment, an office environment, or a server farm). In other example embodiments, the processors or processor-implemented modules are distributed across a number of geographic locations.

Figure 10:
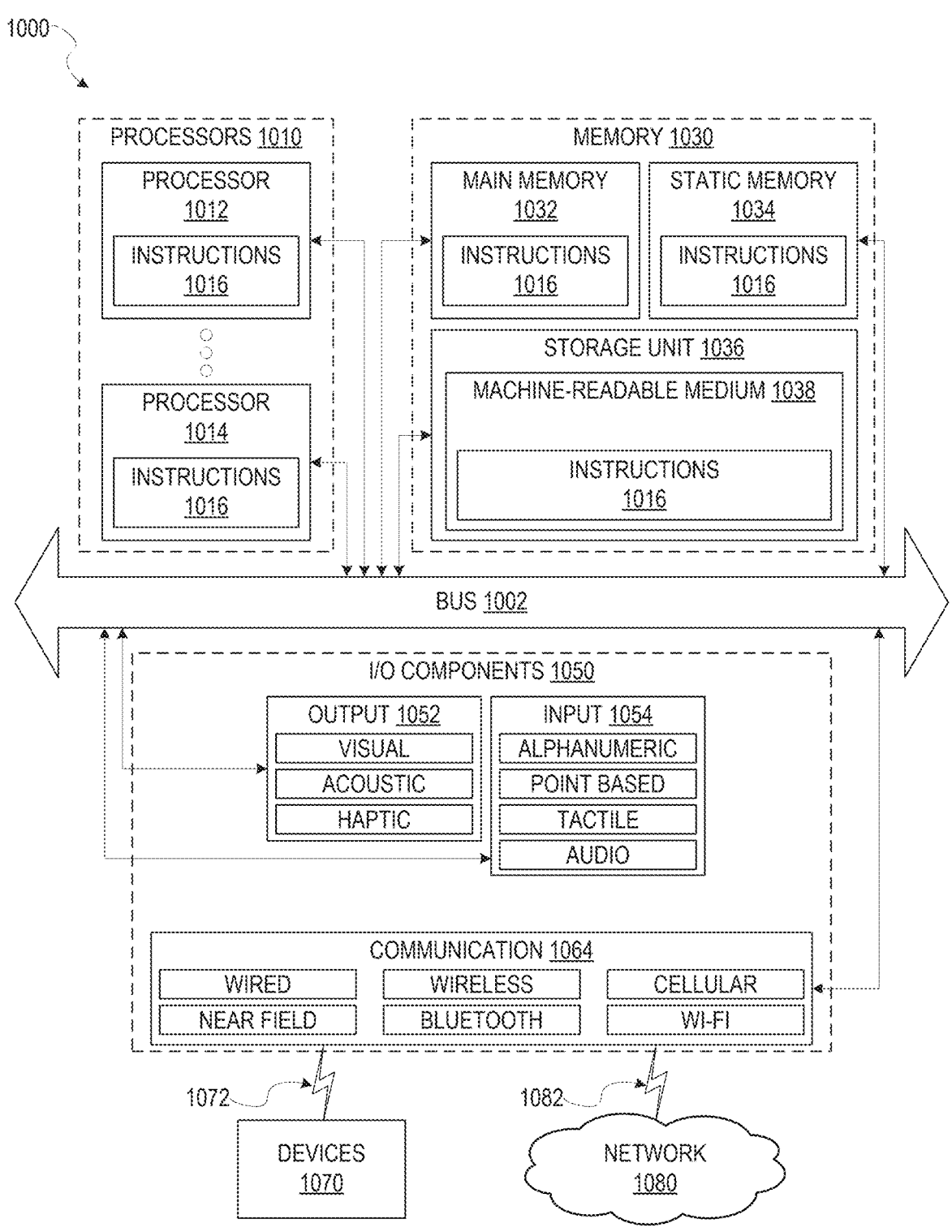
FIG. 10 is a diagram representing a machine in the form of a computer system within which a set of instructions are executed, causing the machine to perform any one or more of the methods discussed herein, according to some example embodiments.

FIG. 10 is a diagrammatic representation of the machine 1000 in the form of a computer system within which a set of instructions may be executed for causing the machine 1000 to perform any one or more of the methodologies discussed herein, according to an example embodiment. FIG. 10 shows components of the machine 1000, which is, according to some embodiments, able to read instructions from a machine-readable medium (e.g., a machine-readable storage medium) and perform any one or more of the methodologies discussed herein. Specifically, FIG. 10 shows a diagrammatic representation of the machine 1000 in the example form of a computer system, within which instructions 1016 (e.g., software, a program, an application, an applet, an app, or other executable code) for causing the machine 1000 to perform any one or more of the methodologies discussed herein can be executed. In alternative embodiments, the machine 1000 operates as a standalone device or can be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 can comprise, but not be limited to, a server computer, a client computer, a personal computer (PC), a tablet computer, a laptop computer, a netbook, or any machine capable of executing the instructions 1016, sequentially or otherwise, that specify actions to be taken by the machine 1000. Further, while only a single machine 1000 is illustrated, the term "machine" shall also be taken to include a collection of machines 1000 that individually or jointly execute the instructions 1016 to perform any one or more of the methodologies discussed herein.

In various embodiments, the machine 1000 comprises processors 1010, memory 1030, and I/O components 1050, which can be configured to communicate with each other via a bus 1002. In an example embodiment, the processors 1010 (e.g., a CPU, a reduced instruction set computing (RISC) processor, a complex instruction set computing (CISC) processor, a CPU, a digital signal processor (DSP), an ASIC, a radio-frequency integrated circuit (RFIC), another processor, or any suitable combination thereof) include, for example, a processor 1012 and a processor 1014 that may execute the instructions 1016. The term "processor" is intended to include multi-core processors 1010 that may comprise two or more independent processors 1012, 1014 (also referred to as "cores") that can execute the instructions 1016 contemporaneously. Although FIG. 10 shows multiple processors 1010, the machine 1000 may include a single processor 1012 with a single core, a single processor 1012 with multiple cores (e.g., a multi-core processor 1012), multiple processors 1010 with a single core, multiple processors 1010 with multiple cores, or any combination thereof.

The memory 1030 comprises a main memory 1032, a static memory 1034, and a storage unit 1036 accessible to the processors 1010 via the bus 1002, according to some embodiments. The storage unit 1036 can include a machine-readable medium 1038 on which are stored the instructions 1016 embodying any one or more of the methodologies or functions described herein. The instructions 1016 can also reside, completely or at least partially, within the main memory 1032, within the static memory 1034, within at least one of the processors 1010 (e.g., within the processor's cache memory), or any suitable combination thereof, during execution thereof by the machine 1000. Accordingly, in various embodiments, the main memory 1032, the static memory 1034, and the processors 1010 are considered machine-readable media 1038.

As used herein, the term "memory" refers to a machine-readable medium 1038 able to store data temporarily or permanently and may be taken to include, but not be limited to, random-access memory (RAN), read-only memory (ROM), buffer memory, flash memory, and cache memory. While the machine-readable medium 1038 is shown, in an example embodiment, to be a single medium, the term "machine-readable medium" should betaken to include a single medium or multiple media (e.g. a centralized or distributed database, or associated caches and servers) able to store the instructions 1016. The term "machine-readable medium" shall also be taken to include any medium, or combination of multiple media, that is capable of storing instructions (e.g., the instructions 1016) for execution by a machine (e.g., the machine 1000), such that the instructions, when executed by one or more processors of the machine (e.g., the processors 1010), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1050 include a wide variety of components to receive input, provide output, produce output, transmit information, exchange information, capture measurements, and so on. In general, it will be appreciated that the I/O components 1050 can include many other components that are not shown in FIG. 10. The I/O components 1050 are grouped according to functionality merely for simplifying the following discussion, and the grouping is in no way limiting. In various example embodiments, the I/O components 1050 include output components 1052 and input components 1054. The output components 1052 include visual components (e.g., a display such as a plasma display panel (PDP), a light emitting diode (LIED) display, a liquid crystal display (LCD), a projector, or a cathode ray tube (CRT)), acoustic components (e.g., speakers), haptic components (e.g., a vibratory motor), other signal generators, and so forth. The input components 1054 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, tiles for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1050 may include communication components 1064 operable to couple the machine 1000 to a network 1080 or devices 1070 via a coupling 1082 and a coupling 1072, respectively. For example, the communication components 1064 include a network interface component or another suitable device to interface with the network 1080. In further examples, the communication components 1064 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1070 may be another machine or any of a wide variety of peripheral devices (e.g., a peripheral device coupled via a USB).

In various example embodiments, one or more portions of the network 1080 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1080 or a portion of the network 1080 may include a wireless or cellular network, and the coupling 1082 may be a Code Division Multiple Access (CDMA) connection, a Global System for Mobile communications (GSM) connection, or another type of cellular or wireless coupling.

Furthermore, the machine-readable medium 1038 is non-transitory (in other words, not having any transitory signals) in that it does not embody a propagating signal. However, labeling the machine-readable medium 1038 "non-transitory" should not be construed to mean that the machine-readable medium 1038 is incapable of movement; the machine-readable medium 1038 should be considered as being transportable from one physical location to another. Additionally, since the machine-readable medium 1038 is tangible, the machine-readable medium 1038 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising: accessing cell library data describing a plurality of cells available for use in a circuit design; generating a set of leakage power-based weights corresponding to the plurality of cells by determining an individual leakage power-based weight for each individual cell, in the plurality of cells, based on a leakage-power parameter of the individual cell;

determining a plurality of cell groups by iteratively clustering cells within the plurality of cells into one or more cell groups based on a set of clustering process inputs until each cell group in the plurality of cell groups is valid, the set of clustering process inputs including the set of leakage power-based weights, the iteratively clustering of cells into the one or more cell groups comprising:

setting a current set of cells that is to be grouped to comprise the plurality of cells, setting a current target cluster number to a number of cells in the current set of cells, and iteratively performing the following operations while a size of the current set of cells is greater than one cell;

determining a current set of cell groups by clustering cells within the current set of cells into the one or more cell groups based on the current target cluster number and the set of clustering process inputs: determining whether each cell group in the current set of cell groups is valid: in response to determining that the one or more cell groups in the current set of cell groups are invalid, adjusting the current target cluster number, and generating a pruned set of cells by pruning a select set of cells from each cell group in the plurality of cell groups.

2. The non-transitory computer-readable medium of claim 1, wherein the adjusting of the current target cluster number comprises decrementing the current target cluster number.

3. The non-transitory computer-readable medium of claim 2, wherein the clustering cells within the current set of cells into one or more cell groups based on the current target cluster number and the set of clustering process inputs comprises:

performing, on the current set of cells, a clustering process that clusters cells in close proximity to each other based on their respective leakage power-based weight.

4. The non-transitory computer-readable medium of claim 3, wherein the clustering process accepts a two-dimensional input for each cell, and wherein the operations comprise:

generating the set of clustering process inputs based on the set of leakage power-based weights by generating a corresponding two-dimensional input for each individual leakage power-based weight in the set of leakage power-based weights, a value of a first dimension of the corresponding two-dimensional input being set to a value of the individual leakage power-based weight, and a value of a second dimension of the corresponding two-dimensional input being set to a fixed value.

5. The non-transitory computer-readable medium of claim 4, wherein the fixed value is zero.

6. The non-transitory computer-readable medium of claim 1, wherein the adjusting of the current target cluster number comprises:

for each invalid cell group in the current set of cell groups:

removing all cells of the invalid cell group from the current set of cells;

generating a set of valid cell groups by splitting the invalid cell group into a set of valid cell groups; and adding the set of valid cell groups to the plurality of cell groups; and adjusting the current target cluster number based on a number of invalid cell groups identified.

7. The non-transitory computer-readable medium of claim 6, wherein the determining whether each cell group in the current set of cell groups is valid comprises, for each select cell group in the current set of cell groups:

determining a set of unique area values found in the select cell group; and for each area value in the set of unique area values:

determining an average ratio value for cells in the select cell group associated with the area value;

determining whether the average ratio value is valid based on a ratio range for the average ratio value; and incrementing a violation count for the select cell group in response to determining that the average ratio value is not valid.

8. The non-transitory computer-readable medium of claim 6, wherein the adjusting the current target cluster number based on a number of invalid cell groups identified comprises:

decrementing the current target cluster number based on the number of invalid cell groups identified.

9. The non-transitory computer-readable medium of claim 7, wherein determining whether the average ratio value is valid based on the ratio range for the average ratio value comprises:

determining the ratio range for the average ratio value based on the average ratio value and a threshold value.

10. The non-transitory computer-readable medium of claim 7, wherein the determining whether the average ratio value is valid based on the ratio range for the average ratio value comprises:

determining whether the average ratio value falls within the ratio range; and determining that the average ratio value is valid in response to determining that the average ratio value falls within the ratio range.

11. The non-transitory computer-readable medium of claim 7, wherein the determining whether the average ratio value is valid based on a ratio range for the average ratio value comprises:

determining whether the average ratio value falls within the ratio range; and determining that the average ratio value is invalid in response to determining that the average ratio value does not fall within the ratio range.

12. The non-transitory computer-readable medium of claim 7, wherein the determining whether each cell group in the current set of cell groups is valid comprises:

determining whether the select cell group is valid based on the violation count.

13. The non-transitory computer-readable medium of claim 12, wherein the determining whether the select cell group is valid based on the violation count comprises:

determining whether the violation count surpasses a violation threshold value; and determining that the select cell group is valid in response to determining that the violation count does not surpass the violation threshold value.

14. The non-transitory computer-readable medium of claim 12, wherein the determining whether the select cell group is valid based on the violation count comprises:

determining whether the violation count surpasses a violation threshold value; and determining that the select cell group is invalid in response to determining that the violation count does surpasses the violation threshold value.

15. The non-transitory computer-readable medium of claim 1, wherein the pruning the select set of cells, from each cell group in the plurality of cells groups, comprises:

performing a delay-area pruning process on each individual cell group in the plurality of cell groups.

16. The non-transitory computer-readable medium of claim 1, wherein the operations comprise:

performing a buffer insertion process on the circuit design based on the pruned set of cells.

17. The non-transitory computer-readable medium of claim 1, wherein the leakage power-based weight of the individual cell comprises a value generated by dividing a leakage power value for the individual cell by an area of the individual cell.

18. The non-transitory computer-readable medium of claim 1, wherein the operations comprise:

prior to generating the set of leakage power-based weights, removing, from the plurality of cells, at least one cell identified as having a leakage power that is an outlier in comparison to other cells in the plurality of cells.

19. A method comprising:

accessing, by a hardware processor, cell library data describing a plurality of cells available for use in a circuit design;

generating, by the hardware processor, a set of metrics corresponding to the plurality of cells by determining a metric for each individual cell, in the plurality of cells, based on an attribute of the individual cell;

determining, by the hardware processor, a plurality of cell groups by iteratively clustering cells within the plurality of cells into one or more cell groups based on a set of clustering process inputs until each cell group in the plurality of cell groups is valid, the set of clustering process inputs including the set of metrics, the iteratively clustering of cells into the one or more cell groups comprising:

setting a current set of cells that is to be grouped to comprise the plurality of cells;

setting a current target cluster number to a number of cells in the current set of cells; and iteratively performing the following operations while a size of the current set of cells is greater than one cell:

determining a current set of cell groups by clustering cells within the current set of cells into the one or more cell groups based on the current target cluster number and the set of clustering process inputs;

determining whether each cell group in the current set of cell groups is valid; and in response to determining that the one or more cell groups in the current set of cell groups are invalid, adjusting the current target cluster number; and generating, by the hardware processor, a pruned set of cells by pruning a select set of cells from each cell group in the plurality of cell groups.

20. A device comprising:

a memory storing instructions; and a hardware processor communicatively coupled to the memory and configured by the instructions to perform operations comprising:

generating a set of metrics corresponding to a plurality of cells available for use in a circuit design, the generating comprising determining a metric for each individual cell, in the plurality of cells, based on an attribute of the individual cell, the plurality of cells being described by cell library data;

determining, by the hardware processor, a plurality of cell groups by iteratively clustering cells within the plurality of cells into one or more cell groups based on a set of clustering process inputs until each cell group in the plurality of cell groups is valid, the set of clustering process inputs including the set of metrics, the iteratively clustering of cells into the one or more cell groups comprising:

setting a current set of cells that is to be grouped to comprise the plurality of cells;

setting a current target cluster number to a number of cells in the current set of cells; and iteratively performing the following operations while a size of the current set determining a current set of cell groups by clustering cells within the current set of cells into the one or more cell groups based on the current target cluster number and the set of clustering process inputs;

determining whether each cell group in the current set of cell groups is valid; and in response to determining that the one or more cell groups in the current set of cell groups are invalid, adjusting the current target cluster number; and generating a pruned set of cells by pruning a select set of cells from each cell group in the plurality of cell groups.

* * * * *